(12) United States Patent
Zhai et al.

(10) Patent No.: US 9,318,474 B2
(45) Date of Patent: Apr. 19, 2016

(54) THERMALLY ENHANCED WAFER LEVEL FAN-OUT POP PACKAGE

(71) Applicant: Apple Inc., Cupertino, CA (US)

(72) Inventors: Jun Zhai, San Jose, CA (US); Yizhang Yang, Sunnyvale, CA (US); Mengzhi Pang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/192,145

(22) Filed: Feb. 27, 2014

(65) Prior Publication Data

US 2015/0171063 A1     Jun. 18, 2015

Related U.S. Application Data

(60) Provisional application No. 61/916,664, filed on Dec. 16, 2013.

(51) Int. Cl.
*H01L 23/34* (2006.01)
*H01L 25/16* (2006.01)
(Continued)

(52) U.S. Cl.
CPC .............. *H01L 25/165* (2013.01); *H01L 23/36* (2013.01); *H01L 23/49816* (2013.01); *H01L 23/5384* (2013.01); *H01L 23/5389* (2013.01); *H01L 24/17* (2013.01); *H01L 24/32* (2013.01); *H01L 24/81* (2013.01); *H01L 24/83* (2013.01); *H01L 25/105* (2013.01); *H01L 25/50* (2013.01); *H01L 25/0655* (2013.01); *H01L 25/0657* (2013.01); *H01L 2224/0401* (2013.01); *H01L 2224/08225* (2013.01); *H01L 2224/32245* (2013.01); *H01L 2224/81894* (2013.01); *H01L 2224/83894* (2013.01); *H01L 2225/0651* (2013.01); *H01L 2225/1023* (2013.01); *H01L 2225/1041* (2013.01); *H01L 2225/1058* (2013.01); *H01L 2225/1094* (2013.01);
(Continued)

(58) Field of Classification Search
CPC ...................... H01L 23/49822; H01L 23/4012; H01L 25/043; H01L 25/0657; H01L 25/074; H01L 25/0756; H01L 25/117; H01L 25/042; H01L 25/0652; H01L 25/0655; H01L 25/071; H01L 25/072; H01L 25/0753; H01L 25/115
See application file for complete search history.

(56) References Cited

U.S. PATENT DOCUMENTS 7,440,281 B2   10/2008   Bailey et al.
7,961,469 B2    6/2011   Schmidt et al.
(Continued)

*Primary Examiner* — Thanh Y Tran
(74) *Attorney, Agent, or Firm* — Meyertons, Hood, Kivlin, Kowert & Goetzel, P.C.; Neal E. Persky; Lawrence J. Merkel

(57) ABSTRACT

In some embodiments, a semiconductor device package assembly may include a first substrate. The semiconductor device package assembly may include a first die electrically connected to the first substrate such that the first die is directly bonded to the first substrate. The semiconductor device package assembly may include a second substrate directly bonded to a surface of the first die. The semiconductor device package assembly may include an electronic memory module. The electronic memory module may be directly bonded to the second substrate. The semiconductor device package assembly may include a thermally conductive material directly applied to the electronic memory module. The semiconductor device package assembly may include a heat spreader directly bonded to the thermally conductive material. The heat spreader may function to transfer heat from the first die and the electronic memory module through the heat spreader from the first side to the second side.

15 Claims, 3 Drawing Sheets

(51) Int. Cl.
*H01L 25/00* (2006.01)
*H01L 23/00* (2006.01)
*H01L 23/36* (2006.01)
*H01L 23/498* (2006.01)
*H01L 23/538* (2006.01)
*H01L 25/10* (2006.01)
*H01L 25/065* (2006.01)

(52) U.S. Cl.
CPC ............... *H01L 2924/1434* (2013.01); *H01L 2924/15311* (2013.01); *H01L 2924/15331* (2013.01); *H01L 2924/18161* (2013.01); *H01L 2924/2064* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01); *H01L 2924/20646* (2013.01); *H01L 2924/20647* (2013.01); *H01L 2924/20648* (2013.01); *H01L 2924/20649* (2013.01)

(56) References Cited

U.S. PATENT DOCUMENTS

| | | | | |
|---|---|---|---|---|
| 8,379,400 | B2* | 2/2013 | Sunohara | H01L 23/147 361/760 |
| 8,710,676 | B2* | 4/2014 | Chou | H01L 23/3675 257/621 |
| 2004/0150102 | A1* | 8/2004 | Lee et al. | 257/723 |
| 2010/0096741 | A1* | 4/2010 | Pan et al. | 257/686 |
| 2010/0246133 | A1 | 9/2010 | Schmidt et al. | |
| 2011/0228482 | A1 | 9/2011 | Schmidt et al. | |
| 2012/0043668 | A1* | 2/2012 | Refai-Ahmed | H01L 23/04 257/777 |
| 2014/0246781 | A1* | 9/2014 | Hosomi | 257/774 |
| 2015/0084192 | A1* | 3/2015 | Chiu | H01L 24/17 257/738 |

\* cited by examiner

THERMALLY ENHANCED WAFER LEVEL FAN-OUT POP PACKAGE

PRIORITY CLAIM

This application claims priority to U.S. Provisional Patent Application No. 61/916,664 entitled "Thermally Enhanced Wafer Level Fan-out POP Package" to Zhai et al. filed on Dec. 16, 2013, all of which is incorporated by reference herein.

BACKGROUND

1. Technical Field

The present invention relates to semiconductor packaging and methods for packaging semiconductor devices. More particularly, some embodiments disclosed herein relate to a thermally efficient package-on-package ("PoP").

2. Description of the Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages. FIG. 1 depicts an embodiment of a current package on package format 100. Package 100 may include several air gaps 110 which are formed within the package during manufacture. However, air is known as a very good insulator and as such results in poor thermal conduction between the components of the package.

SUMMARY

In some embodiments, a system may include a thermally enhanced package on package format. The thermally enhanced package may be formed assembling an SOC package with a memory package through solder joint interconnect. In some embodiment, a heat spreader may be attached to the POP package using thermal interface material as the adhesive. Significant improvement of thermal resistance over conventional POP package may be achieved with such a configuration. The thermal performance of this package may be comparable to conventional flip chip BGA where heat is dissipated through the metal lid. To achieve ultra-thin Z height (e.g., less than 1 mm thick POP format), fan-out wafer level package of both SOC package and memory package may be applied.

In some embodiments, a semiconductor device package assembly may include a first substrate. The semiconductor device package assembly may include a first die electrically connected to the first substrate such that the first die is directly bonded to the first substrate. The semiconductor device package assembly may include a second substrate directly bonded to a surface of the first die. The semiconductor device package assembly may include an electronic memory module. The electronic memory module may be directly bonded to the second substrate. The semiconductor device package assembly may include a thermally conductive material directly applied to the electronic memory module. The semiconductor device package assembly may include a heat spreader directly bonded to the thermally conductive material. The heat spreader may function to transfer heat from the first die and the electronic memory module through the heat spreader.

In some embodiments, the method may include forming a semiconductor device package assembly. The method may include forming a first substrate. The method may include electrically connecting the semiconductor device package. The method may include directly bonding a first die to the first substrate. The method may include directly bonding a second substrate to a surface of the first die. The method may include directly bonding a third substrate forming at least a portion of an electronic memory module to the second substrate. The method may include applying a thermally conductive material directly to a second surface of the electronic memory module. The method may include directly bonding a first side of a heat spreader to the thermally conductive material, wherein the heat spreader comprises a second side substantially opposite the first side. The method may include transferring heat from the first die and the electronic memory module through the heat spreader from the first side to the second side of the heat spreader.

BRIEF DESCRIPTION OF THE DRAWINGS

The following detailed description makes reference to the accompanying drawings, which are now briefly described.

Figure 1:
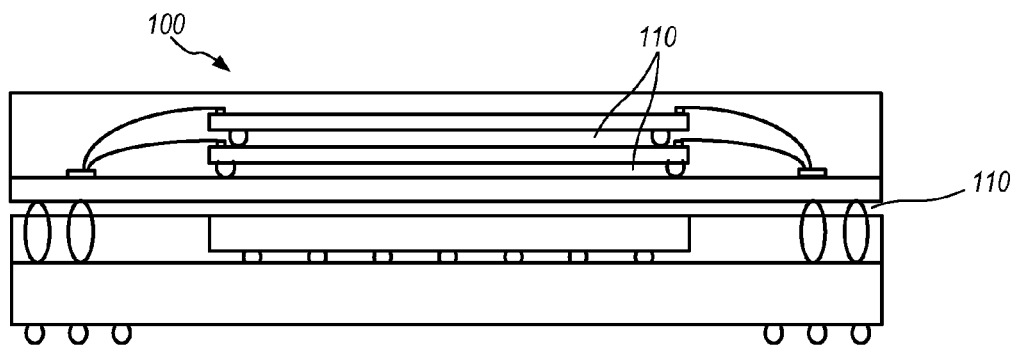
FIG. 1 depicts an embodiment of a current package on package format.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112, paragraph six, interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Figure 2:
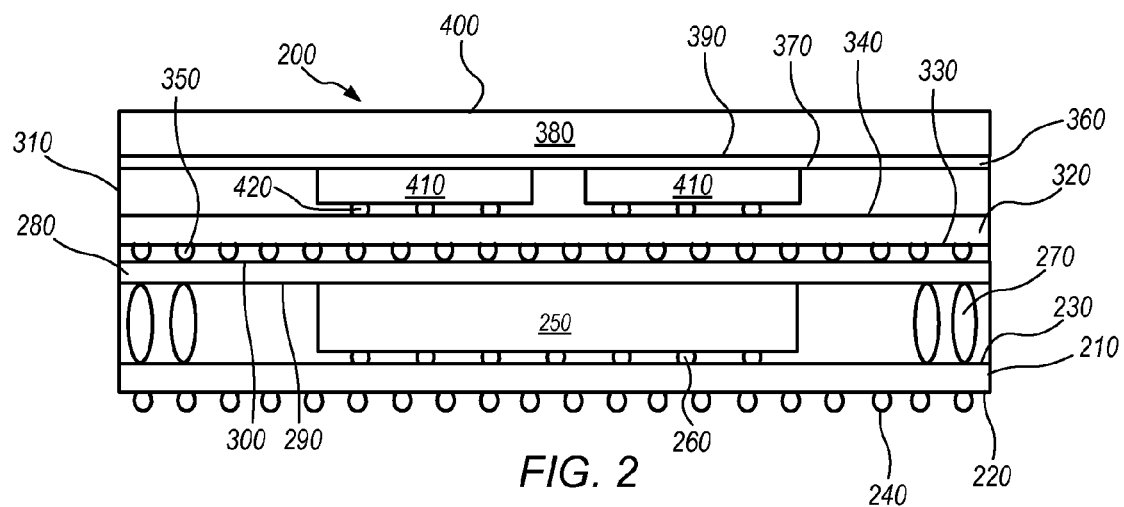
FIG. 2 depicts an embodiment of a thermally enhanced package on package format including two redistribution layers. At least some of the electrical conductors are not depicted for the sake of clarity.

FIG. 2 depicts an embodiment of a thermally enhanced package on package format 200 including two redistribution layers. At least some of the electrical conductors are not depicted for the sake of clarity. In some embodiments, a semiconductor device package assembly 200 may include a first substrate 210 (or a first redistribution layer) including a first surface 220, a second surface 230 substantially opposite of the first surface, and a first set of electrical conductors 240 coupled to the first surface. The first set of electrical conductors may function to electrically connect the semiconductor device package assembly to, for example, other electrical components. The semiconductor device package assembly may include a first die 250 electrically connected to the second surface of the first substrate using a second set of electrical conductors 260 such that the first die is directly bonded to the first substrate. The second set of electrical conductors may function to electrically connect to at least some of the first set of electrical conductors through the redistribution layer 210. The semiconductor device package assembly may include a third set of electrical conductors 270 coupled to the second surface of the first substrate. The third set of electrical conductors may function to electrically connect to at least some of the first set of electrical conductors 240 and/or to the second set of electrical connectors 260, through the redistribution layer 210. The semiconductor device package assembly may include a second substrate (or second redistribution layer) 280 including a first surface 290 and a second surface 300 substantially opposite of the first surface. The first surface may be directly bonded to a surface of the first die opposite the second set of electrical conductors. The semiconductor device package assembly may include an electronic memory module 310. The electronic memory module may include a third substrate (or third redistribution layer) 320 including a first surface 330 and a second surface 340 substantially opposite of the first surface. The first surface may be directly bonded to the second surface of the second substrate using a fourth set of electrical conductors 350. The second surface may be coupled to conductors 420 on the die 410.

Generally, the redistribution layers 210, 280, and 320 may include conductors and electrically insulating material to form connections between conductors bonded to the top surface of the redistribution layer and conductors bonded to the bottom surface of the redistribution layer. That is, the redistribution layer may provide connection between conductors that are not vertically aligned with each other (although vertically aligned connections may also be made). Since the redistribution layers include metal conductors, they may also be efficient heat conductors as well. The redistribution layers may also serve as substrates for carrying the various semiconductor die 250 and 410, providing structure as well, in the illustrated embodiments. Other embodiments may include other types of substrates as desired.

Each of the die 250 and 410 may be encapsulated using any suitable encapsulant. The encapsulant may protect the die and provide structural stability.

The semiconductor device package assembly may include a thermally conductive material 360 directly applied to a second surface 370 of the electronic memory module. The semiconductor device package assembly may include a heat spreader 380 including a first side 390 and a second side 400 substantially opposite the first side. The first side may be directly bonded to the thermally conductive material. The heat spreader may function to transfer heat from the first die and the electronic memory module through the heat spreader from the first side to the second side.

The heat spreader may function as a heat exchanger that moves heat between a heat source, and a secondary heat exchanger whose surface area and geometry are more favorable than the source. Such a spreader is most often simply a plate made of copper, which has a high thermal conductivity. In some embodiments, if height is not an issue, and heat spreader may further include a heat sink (e.g. fins to conduct the heat into the air or the like).

Heat spreaders transfer heat from electronic components to passive or active heat sinks Typically they are used to cool chips in personal computers, laptops, notebooks, cell phones, and other electronic devices. Heat spreaders are used in critical locations for more efficient heat removal. Heat spreaders may be used to reduce electrical component hot spots, such that the component's lifetime is increased and the component's performance is improved.

In some embodiments, the heat spreader may provide structural stability to the package assembly. The cover may be formed from, for example, copper, aluminum alloys, high thermal conductivity ceramics, composite graphite, etc.

Directly bonding the different layers of the package directly to one another substantially removes any air gaps in the package relative to the configuration illustrated in FIG. 1. In some embodiments, substantially no air gap is present between the electronic memory module and the second substrate. In some embodiments, heat travels from the first die to the heat spreader without traversing an air gap. In the current embodiments described herein have significantly improved thermal resistance compared to packages produced with air gaps.

Figure 3:
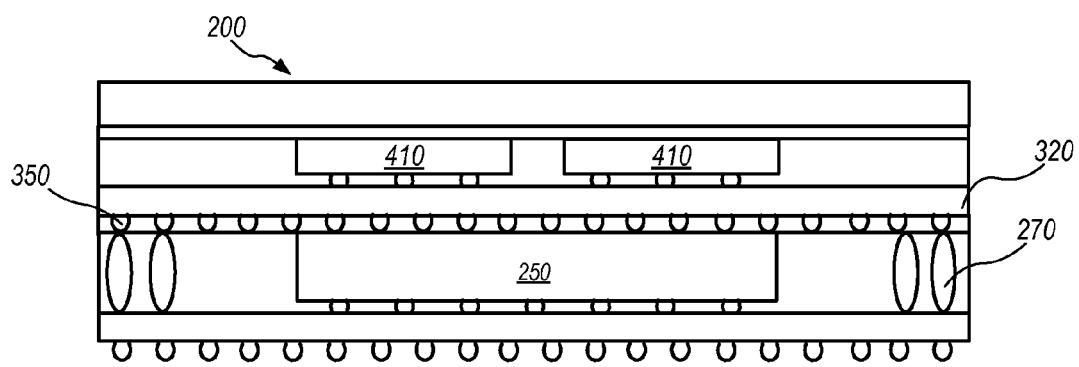
FIG. 3 depicts an embodiment of a thermally enhanced package on package format including one redistribution layer. At least some of the electrical conductors are not depicted for the sake of clarity.

Directly bonding layers of the package together may result in low profile (e.g., Z height<1 mm) packages. Z height may be reduced by using fan out configurations for one or more components of the package. For example, the electronic memory module 310 may include two or more die 410 (e.g., as depicted in FIGS. 2-3) in what is commonly known as a fan out configuration. In some embodiments, first and/or second die may be coupled as flip chip configurations.

FIG. 3 depicts an embodiment of a thermally enhanced package on package format 200 including one redistribution layer. At least some of the electrical conductors are not depicted for the sake of clarity. In some embodiments, the package may include only one redistribution layer. For example, as depicted in FIG. 3 the package 200 may not include a second substrate 280. In such an embodiment fourth set of electrical conductors 350 may be directly bonded to the first die 250 and the third set of conductors 270. Those conductors 350 that are connected to conductors 270 may be used for signal and power/ground interconnect. Those conductors 350 that contact the die 250 may not be used electrically (e.g. they may be "no connects" in the redistribution layer 320), but they may provide a low thermal resistance path for heat from the die 250.

Each of the conductors 240, 260, 270, 350, and 420 may be formed in any desired fashion. For example, in an embodiment, the conductors 260 and 420 may be controlled-collapse chip connect (C4) bumps deposited as part of the manufacturing process for the die 250 and 410. The conductors 240, 270, and 350 may be ball grid array (BGA) solder balls. Other conductors may be used as desired.

In some embodiments, the electronic memory module may include at least one second die electrically connected to the second surface of the third substrate. The second die may electrically connect the second surface using a fifth set of electrical conductors such that the second die is directly bonded to the third substrate.

Figure 4:
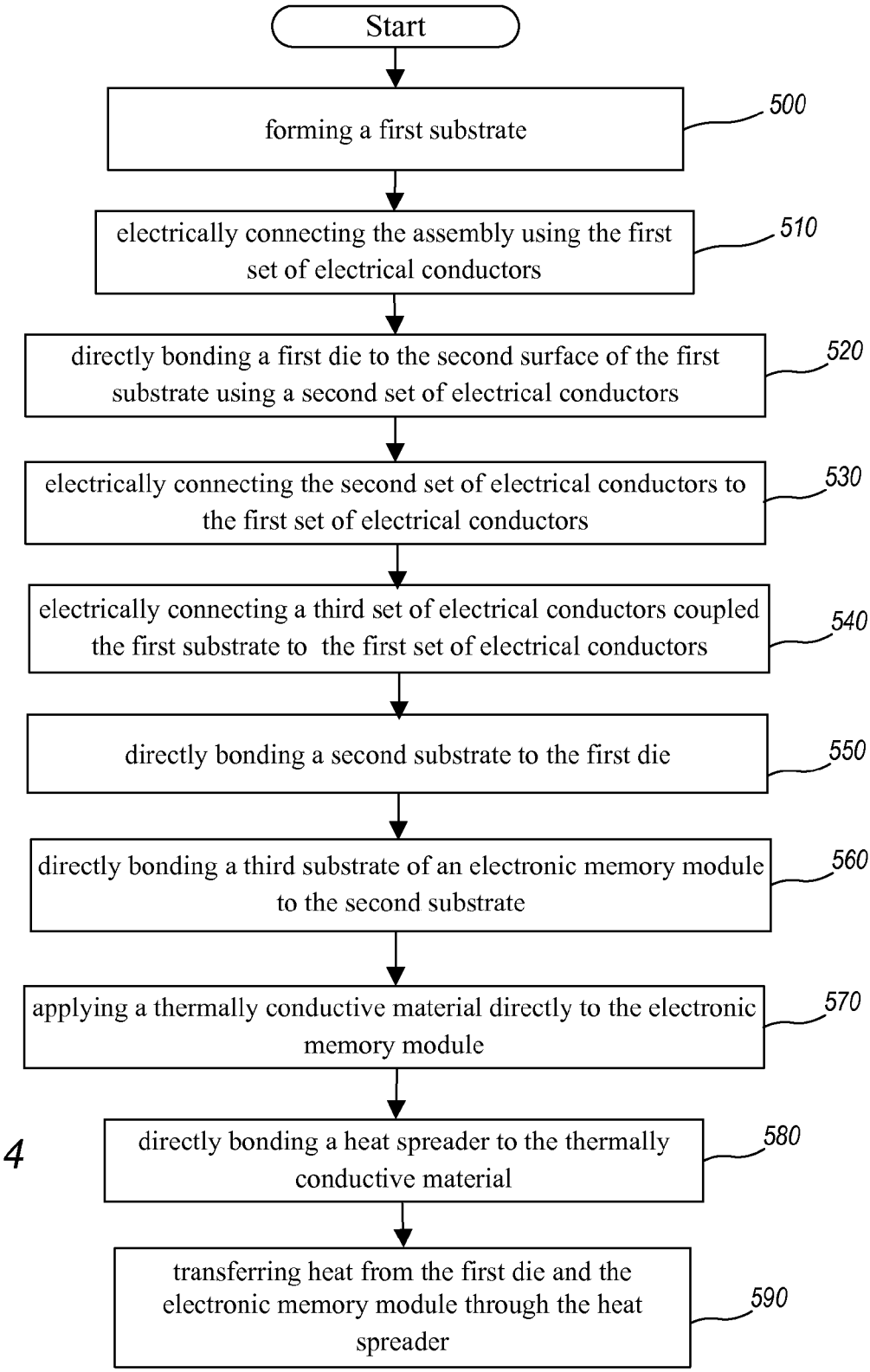
FIG. 4 depicts an embodiment of flow chart representing a method of forming at least a portion of a thermally enhanced package on package format.
Figure 5A:
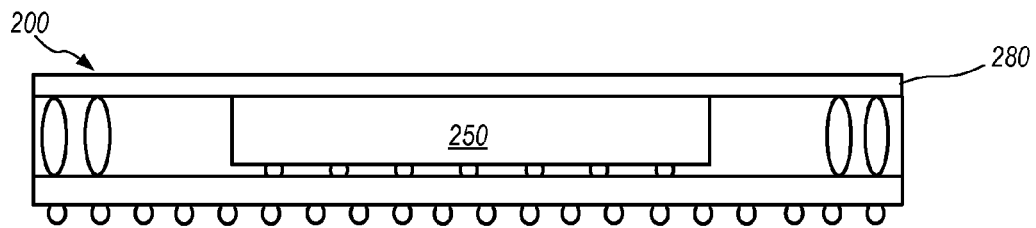
FIGS. 5A-D depict an embodiment of an assembly of several thermally enhanced package on package formats.
Figure 5B:
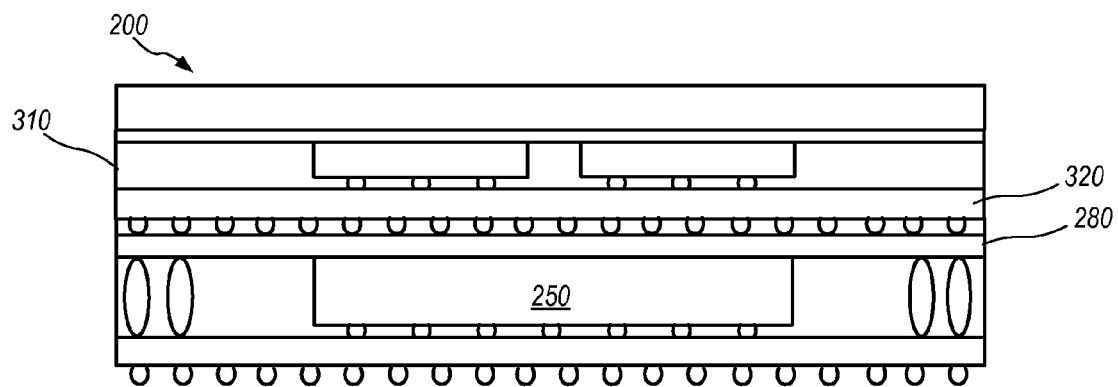

In some embodiments, the method may include forming a semiconductor device package assembly. FIG. 4 depicts an embodiment of flow chart representing a method of forming at least a portion of a thermally enhanced package on package format. FIGS. 5A-D depict an embodiment of an assembly of several thermally enhanced package on package formats 200. The method may include forming 500 a first substrate. The method may include electrically connecting the semiconductor device package 510. The method may include directly bonding 520 a first die to the first substrate using a second set of electrical conductors. The method may include electrically connecting 530 the second set of electrical conductors to the first set of electrical conductors. The method may include electrically connecting 540 a third set of electrical conductors coupled the first substrate to the first set of electrical conductors. The method may include directly bonding 550 a second substrate 280 to the first die 250 (e.g., as depicted in FIG. 5A). The method may include directly bonding 560 a third substrate 320 forming at least a portion of an electronic memory module 310 to the second substrate 280 (e.g., as depicted in FIG. 5B). The method may include applying 570 a thermally conductive material directly to a second surface of the electronic memory module. The method may include directly bonding 580 a first side of a heat spreader to the thermally conductive material, wherein the heat spreader comprises a second side substantially opposite the first side. The method may include transferring 590 heat from the first die and the electronic memory module through the heat spreader from the first side to the second side of the heat spreader.

Figure 5C:
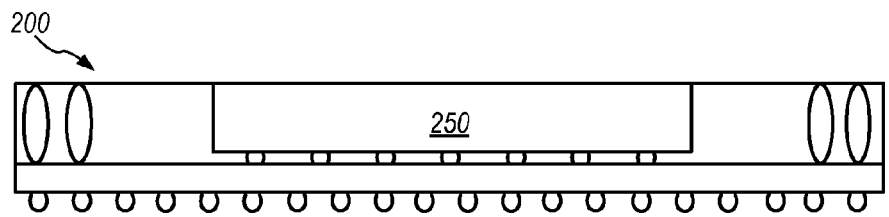
Figure 5D:
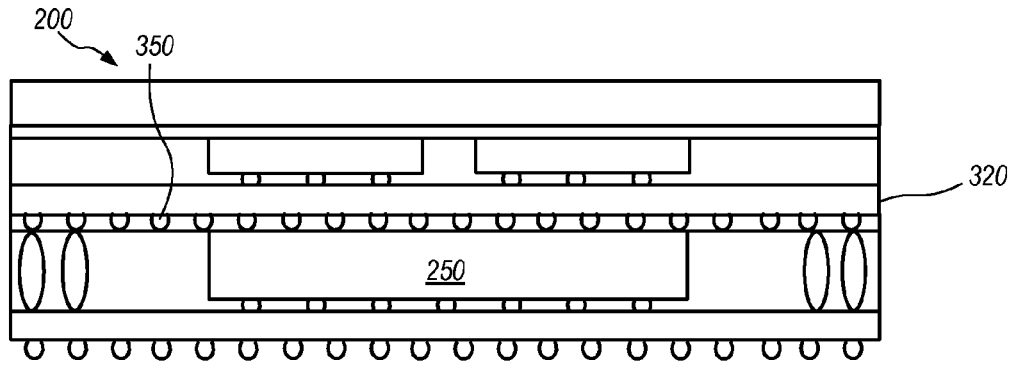

In some embodiments, a method may include directly bonding the third substrate 320 to the first die 250 using fourth set of electric conductors 350 (e.g., as depicted in FIG. 5C-D).

What is claimed is:

1. A semiconductor device package assembly, comprising:
   a first substrate including a first surface, a second surface substantially opposite of the first surface, and a first set of electrical conductors coupled to the first surface configured to electrically connect the semiconductor device package assembly;
   a first die electrically connected to the second surface of the first substrate using a second set of electrical conductors such that the first die is directly bonded to the first substrate, wherein the second set of electrical conductors are configured to electrically connect to at least some of the first set of electrical conductors;
   a third set of electrical conductors coupled to the second surface of the first substrate, wherein the third set of electrical conductors are configured to electrically connect to at least some of the first set of electrical conductors;
   a second substrate comprising a first surface and a second surface substantially opposite of the first surface, wherein the first surface is directly bonded to a surface of the first die opposite the second set of electrical conductors;
   an electronic memory module comprising a third substrate comprising a first surface and a second surface substantially opposite of the first surface, wherein the first surface is directly bonded to the second surface of the second substrate using a fourth set of electrical conductors;
   wherein the electronic memory module comprises at least two second die electrically connected to the second surface of the third substrate in a fan out configuration using a fifth set of electrical conductors such that the at east two second die are directly bonded to the third substrate;
   a thermally conductive material directly applied to a second surface of the electronic memory module; and
   a heat spreader comprising a first side and a second side substantially opposite the first side, wherein the first side is directly bonded to the thermally conductive material, and wherein the heat spreader is configured to transfer heat from the first die and the electronic memory module through the heat spreader from the first side to the second side, wherein at least a portion of the heat transferred from the first die is conveyed through the second substrate and the electronic memory module to the second side of the heat spreader.

2. The assembly of claim 1, wherein the electronic memory module comprises:
   at least one second die electrically connected to the second surface of the third substrate using a fifth set of electrical conductors such that the second die is directly bonded to the third substrate.

3. The assembly of claim 1, wherein substantially no air gap is present between the electronic memory module and the second substrate.

4. The assembly of claim 1, wherein, during use, heat travels from the first die to the heat spreader without traversing an air gap.

5. The assembly of claim 1, wherein a Z height of the assembly is less than 1 mm.

6. The assembly of claim 1, wherein the first die is connected to the second surface of the first substrate using a flip chip configuration.

7. A semiconductor device package assembly, comprising:
a first substrate including a first surface, a second surface substantially opposite of the first surface, and a first set of electrical conductors coupled to the first surface configured to electrically connect the semiconductor device package assembly;
a first die electrically connected to the second surface of the first substrate using a second set of electrical conductors such that the first die is directly bonded to the first substrate, wherein the second set of electrical conductors are configured to electrically connect to at least some of the first set of electrical conductors;
a third set of electrical conductors coupled to the second surface of the first substrate, wherein the third set of electrical conductors are configured to electrically connect to at least some of the first set of electrical conductors;
an electronic memory module comprising a third substrate comprising a first surface and a second surface substantially opposite of the first surface, wherein the first surface is directly bonded to a surface of the first die opposite the second set of electrical conductors;
wherein the electronic memory module comprises at least one second die electrically connected to the second surface of the third substrate using a fifth set of electrical conductors such that the second die is directly bonded to the third substrate;
a thermally conductive material directly applied to the second surface of the electronic memory module; and
a heat spreader comprising a first side and a second side substantially opposite the first side, wherein the first side is directly bonded to the thermally conductive material, and wherein the heat spreader is configured to transfer heat from the first die and the electronic memory module through the heat spreader from the first side to the second side, wherein, during use, heat is transferred from the first die to the heat spreader without traversing an air gap.

8. The assembly of claim 7, wherein the electronic memory module comprises:
at least two second die electrically connected to the second surface of the third substrate in a fan out configuration using a fifth set of electrical conductors such that the at least two second die are directly bonded to the third substrate.

9. The assembly of claim 7, wherein a Z height of the assembly is less than 1 mm.

10. The assembly of claim 7, wherein the first die is connected to the second surface of the first substrate using a flip chip configuration.

11. A method for forming a semiconductor device package assembly, comprising:
forming a first substrate comprising a first surface, a second surface substantially opposite of the first surface, and a first set of electrical conductors coupled to the first surface;
electrically connecting the semiconductor device package assembly using the first set of electrical conductors;
directly bonding a first die to the second surface of the first substrate using a second set of electrical conductors such that the first die is electrically connected to the first substrate;
electrically connecting the second set of electrical conductors to at least some of the first set of electrical conductors;
electrically connecting a third set of electrical conductors coupled to the second surface of the first substrate to at least some of the first set of electrical conductors;
directly bonding a first surface of a second substrate to a surface of the first die opposite the second set of electrical conductors, wherein the second substrate comprises a second surface substantially opposite of the first surface;
directly bonding a first surface of a third substrate forming at least a portion of an electronic memory module to the second surface of the second substrate using a fourth set of electrical conductors, wherein the third substrate comprises a second surface substantially opposite of the first surface;
directly bonding at least two second die forming at least a portion of the electronic memory module to the second surface of the third substrate in a fan out configuration using a fifth set of electrical conductors such that the at least two second die are electrically connected to the third substrate;
applying a thermally conductive material directly to a second surface of the electronic memory module;
directly bonding a first side of a heat spreader to the thermally conductive material, wherein the heat spreader comprises a second side substantially opposite the first side; and
transferring heat from the first die and the electronic memory module through the heat spreader from the first side to the second side of the heat spreader, wherein, during use, heat is transferred from the first die to the heat spreader without traversing an air gap.

12. The method of claim 11, wherein the electronic memory module comprises:
directly bonding a second die to the second surface of the third substrate using a fifth set of electrical conductors such that the second die is electrically connected to the third substrate.

13. The method of claim 11, wherein substantially no air gap is present between the electronic memory module and the second substrate.

14. The method of claim 11, wherein a Z height of the assembly is less than 1 mm.

15. The method of claim 11, wherein the first die is connected to the second surface of the first substrate using a flip chip configuration.

* * * * *